(12) United States Patent
Okazaki (10) Patent No.: US 6,300,832 B1
(45) Date of Patent: Oct. 9, 2001

(54) GAIN VARIABLE AMPLIFIER APPARATUS HAVING IMPROVED GAIN CONTROL LINEARITY CHARACTERISTICS

(75) Inventor: Yukio Okazaki, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/500,924

(22) Filed: Feb. 9, 2000

(30) Foreign Application Priority Data

Feb. 9, 1999 (JP) .................................................. 11-030809

(51) Int. Cl.[7] .................................................. H03F 3/45
(52) U.S. Cl. ............................. 330/254; 330/256; 327/359
(58) Field of Search ................................. 330/254, 256; 327/359

(56) References Cited

U.S. PATENT DOCUMENTS

| | | | |
|---|---|---|---|
| 5,910,751 | * | 6/1999 | Winn et al. ........................... 327/560 |
| 6,020,786 | * | 2/2000 | Ashby ................................. 330/256 |
| 6,072,366 | * | 2/2000 | Maeda et al. ......................... 330/254 |

FOREIGN PATENT DOCUMENTS

| | | |
|---|---|---|
| 57-127311 | 8/1982 | (JP) . |
| 63-309010 | 12/1988 | (JP) . |
| 64-57828(01) | 3/1989 | (JP) . |
| 1-241207 | 9/1989 | (JP) . |
| 3-173210 | 7/1991 | (JP) . |
| 8-46463 | 2/1996 | (JP) . |
| 9-502316 | 3/1997 | (JP) . |

OTHER PUBLICATIONS

Japanese Office Action dated Jan. 4, 2000 with partial translation.
Paul R. Gray et al., "Analysis and Design of Analog Integrated Circuits",John Wiley & Sons, Inc., pp. 667–675, 1997.

* cited by examiner

Primary Examiner—Robert Pascal
Assistant Examiner—Herny Choe
(74) Attorney, Agent, or Firm—McGinn & Gibb, PLLC

(57) ABSTRACT

In a gain variable amplifier apparatus, a thermal voltage proportional circuit converts a first control voltage into a second control voltage proportional to a thermal voltage, the gain of a gain variable amplifier being controlled by the second control voltage.

5 Claims, 7 Drawing Sheets

GAIN VARIABLE AMPLIFIER APPARATUS HAVING IMPROVED GAIN CONTROL LINEARITY CHARACTERISTICS

BACKGROUND OF THE INVENTION

1. Field of the Invention

The present invention relates to a gain variable amplifier apparatus.

2. Description of the Related Art

A first prior art gain variable amplifier apparatus is formed by a single stage gain variable amplifier. This will be explained later in detail.

In the above-described first prior art gain variable amplifier apparatus, however, the region of linear gain characteristics is narrow, and also, the gain is dependent upon the thermal voltage.

A second prior art gain variable amplifier apparatus is formed by three stages of gain variable amplifiers connected in series (see JP-A-8-46463). The reference voltages of the gain variable amplifiers are made different from each other to obtain a total gain having a wider linear relationship. This also will be explained later in detail.

The above-described second gain variable amplifier apparatus, however, needs a plurality of gain variable amplifiers to achieve a wider gain control range, which would increase the power consumption.

SUMMARY OF THE INVENTION

It is an object of the present invention to compensate for the thermal voltage component in the gain characteristics.

Another object is to enlarge the region of the linear gain control relationship of the gain characteristics.

According to the present invention, in a gain variable amplifier apparatus, a thermal voltage proportional circuit converts a first control voltage into a second control voltage proportional to a thermal voltage, and the gain of a gain variable amplifier is controlled by the second control voltage. Thus, the thermal voltage component in the gain characteristics is compensated for.

Also, in a gain variable amplifier apparatus, a control voltage correction circuit including a plurality of differential amplifiers having different inflection point characteristics converts a first control voltage into a second control voltage, and the gain of a gain variable amplifier is controlled by the second control voltage. Thus, the linear relationship of the gain characteristics becomes wider.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENT

Before the description of the preferred embodiment, prior art gain variable amplifier apparatuses will be explained with reference to FIGS. 1, 2, 3 and 4.

Figure 1:
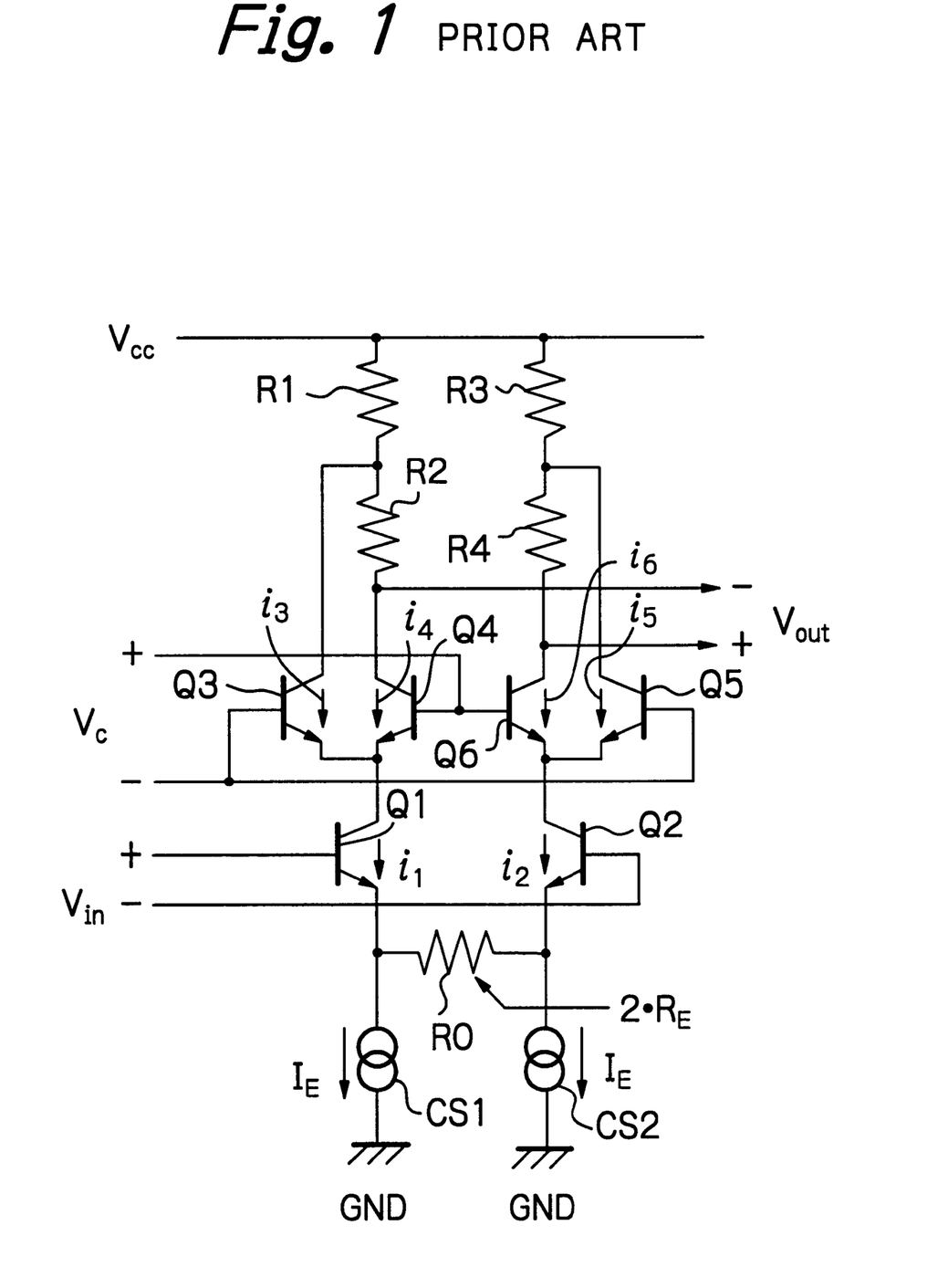
FIG. 1 is a circuit diagram illustrating a first prior art gain variable amplifier apparatus.

In FIG. 1, which illustrates a first prior art gain variable amplifier apparatus, a differential pair formed by transistors Q1 and Q2 is connected to a current circuit formed by two constant current sources CS1 and CS2 each having a current $I_E$ and an emitter resistor R0 having a resistance $2 \cdot R_E$, the current circuit being connected to a ground line GND. Note that the bases of the transistors Q1 and Q2 receive complementary input voltages whose amplitude is $V_{in}$.

Also, a differential pair formed by transistors Q3 and Q4 associated with resistors R1 and R2 connected in series is connected to the collector of the transistor Q1. In this case, the collector of the transistor Q3 is connected via the resistor R1 to a power supply line $V_{CC}$, while the collector of the transistor Q4 is connected via the resistors R1 and R2 to the power supply line $V_{CC}$. The base voltages of the transistors Q3 and Q4 are controlled by complementary control voltages whose difference is $V_C$.

Also, a differential pair formed by transistors Q5 and Q6 associated with resistors R3 and R4 connected in series is connected to the collector of the transistor Q2. In this case, the collector of the transistor Q5 is connected via the resistor R3 to the power supply line $V_{CC}$, while the collector of the transistor Q6 is connected via the resistors R3 and R4 to the power supply line $V_{CC}$. The base voltages of the transistors Q5 and Q6 are controlled by the complementary control voltages whose difference is $V_C$.

Note that the collectors of the transistors Q4 and Q6 generate complementary output voltages whose difference is $V_{out}$.

In FIG. 1, the minimum gain is determined by currents flowing through the transistors Q3 and Q5 and the resistances of the resistors R1 and R3, while the maximum gain is determined by currents flowing through the transistors Q4 and Q6, the resistance of the resistors R1 and R2, and the resistance of the resistors R3 and R4.

The small signal currents $i_1$, and $i_2$ flowing through the transistor Q1 and Q2, respectively, are represented by $$i_1 = g_{m1} \cdot V_{in}$$

$$i_2 = g_{m2} \cdot V_{in}$$

where $g_{m1}$ and $g_{m2}$ are the transfer conductance of a differential amplifier formed by the transistors Q1 and Q2 and the resistor R0, respectively. Therefore, $$i_1 = V_{in}/(V_T/I_E + R_E) \quad (1)$$

$$i_2 = V_{in}/(-V_T/I_E + R_E) \quad (2)$$

where $V_T$ is a thermal voltage;

$I_E$ is a current flowing through each of the constant current sources CS1 and CS2; and $R_E$ is a half value of the resistance of the resistor R0. Also, the thermal voltage $V_T$ is represented by $kT/q$ where k is the Boltzmann constant, T is the absolute temperature, and q is an electric charge of an electron.

In this case, the equations (1) and (2) are replaced by $$i_1-i_2=2\cdot V_{in}\cdot(V_T/I_E+R_E) \quad (3)$$

Also, the small signals currents $i_3$ and $i_4$ flowing through the transistors Q3 and Q4, respectively, are represented by $$i_3=i_1/(1+\exp(V_C/V_T)) \quad (4)$$

$$i_4=i_1/(1+\exp(-V_C/V_T)) \quad (5)$$

On the other hand, the currents $i_5$ and $i_6$ flowing through the transistors Q5 and Q6, respectively, are represented by $$i_5=i_2/(1+\exp(V_C/V_T)) \quad (6)$$

$$i_6=i_2/(1+\exp(-V_C/V_T)) \quad (7)$$

Further, the output voltage $V_{out}$ is represented by $$V_{out}=R1\cdot i_1+R2\cdot i_4-R3\cdot i_2-R4\cdot i_6 \quad (8)$$

Here, since the values of the resistors R1, R2, R3 and R4 are usually set so that R1=R3 and R2=R4, the equation (8) is replaced by $$V_{out}=R1(i_1-i_2)+R2(i_2-i_4)=2\cdot V_{in}/(V_T/I_E+R_E)\cdot(R1+R2/(1+\exp(-V_C/V_T)))=2\cdot V_{in}/(V_T/I_E+R_E)\cdot(R1+R2/2\cdot(1+\tan h(-V_C/V_T))) \quad (9)$$

Figure 2:
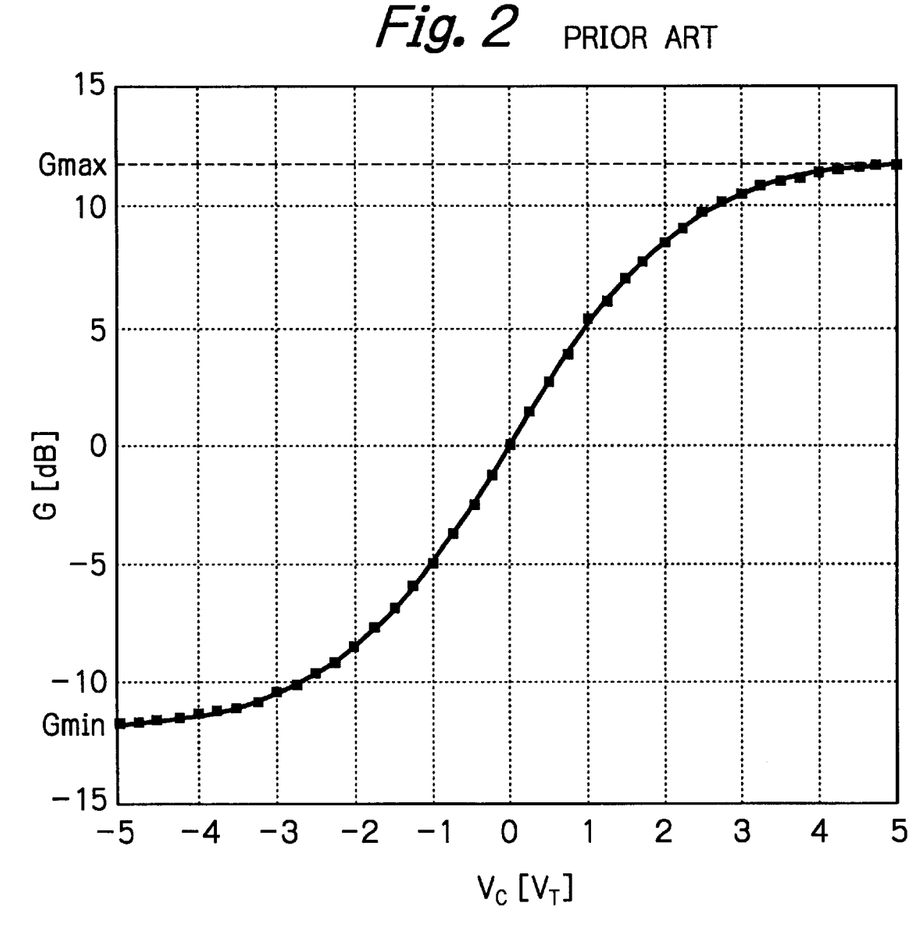
FIG. 2 is a graph showing the gain characteristics of the gain variable amplifier apparatus of FIG. 1.

Thus, the gain G of the gain variable amplifier of FIG. 1 is dependent upon the hyperbolic-tangent function of the control voltage $V_C$ as shown in FIG. 2. In FIG. 2, when the control voltage $V_C$ is from about $-1V_T$ to about $1V_T$, the gain G is decibel-linearly proportional to the control voltage $V_C$. However, when the control voltage $V_C$ becomes smaller than about $-V_T$ or larger than about $1V_T$, the gain G is greatly deviated from the decibel-linear relationship and is finally approximated to the maximum gain $G_{max}$ or the minimum gain $G_{min}$.

Also, the gain G of the gain variable amplifier of FIG. 1 is inversely-proportional to the thermal voltage $V_T$.

Figure 3:
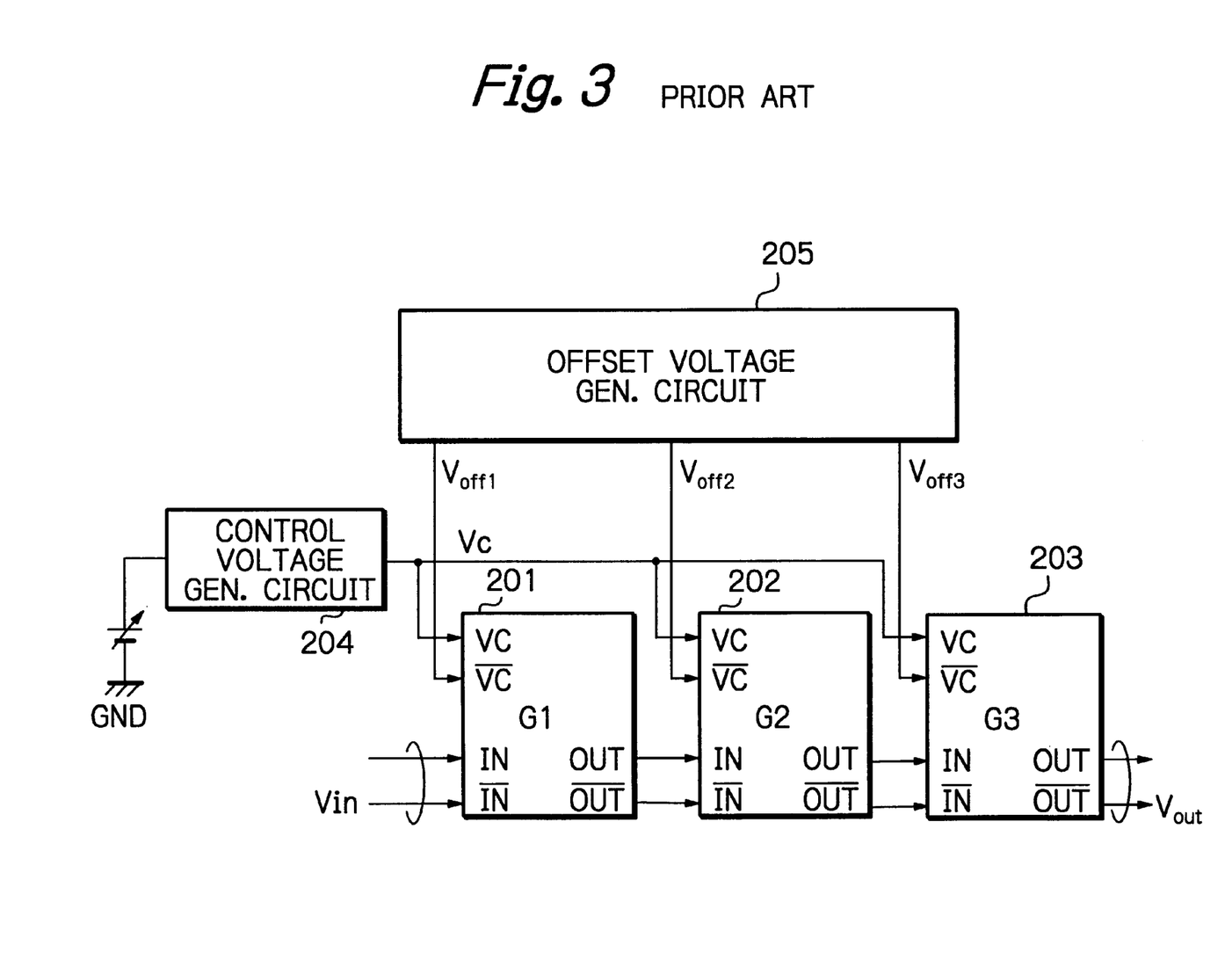
FIG. 3 is a block circuit diagram illustrating a second prior art gain variable amplifier apparatus.

In FIG. 3, which illustrates a second prior art gain variable amplifier apparatus (see JP-A-8-46463), three gain variable amplifiers 201, 202 and 203 each having the same configuration as the gain variable amplifier of FIG. 1 are connected in series to receive complementary inputs whose difference is represented by $V_{in}$ and generate complementary output voltages whose difference is represented by $V_{out}$.

Figure 4:
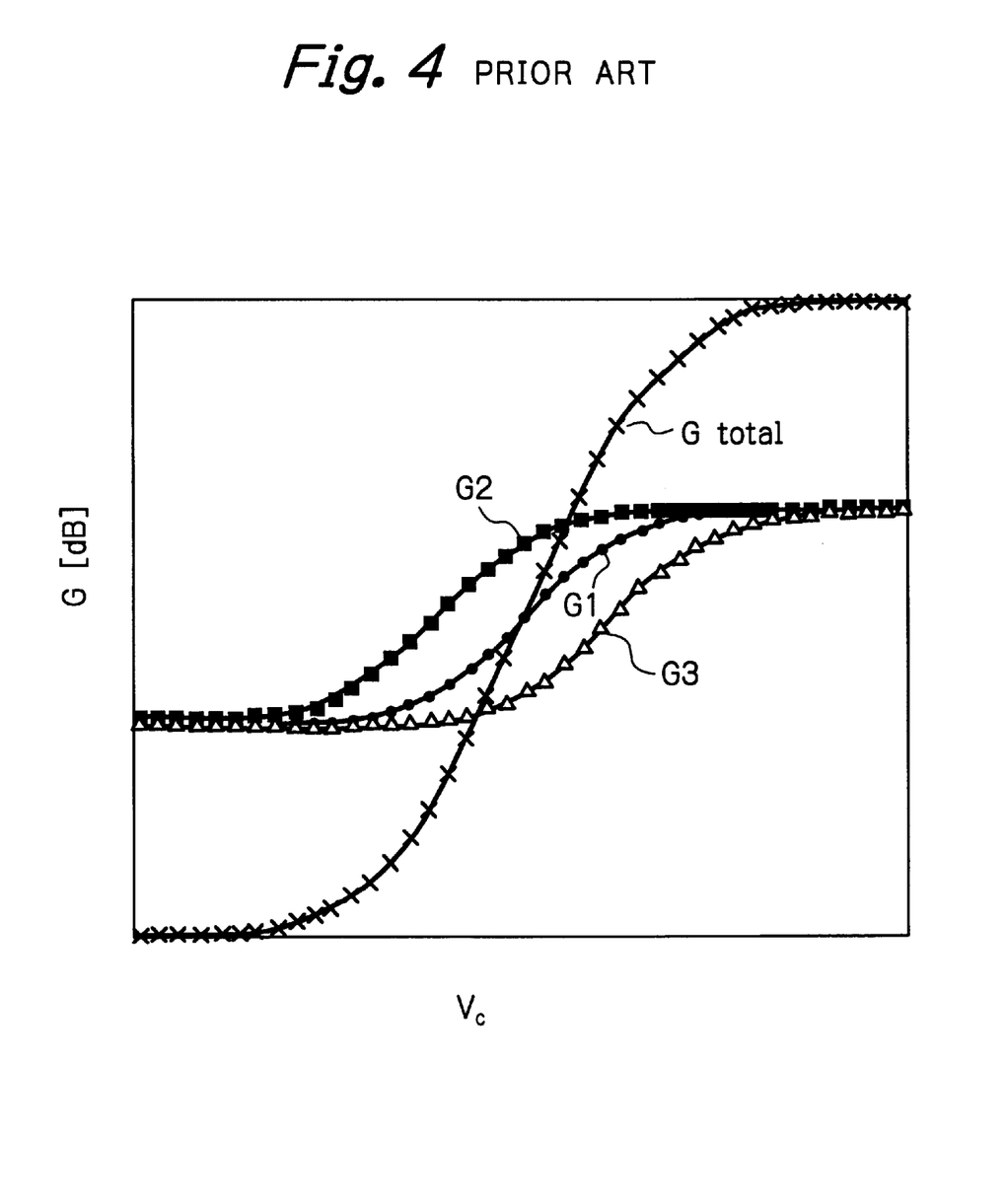
FIG. 4 is a graph showing the gain characteristics of the gain variable amplifier apparatus of FIG. 3.

A control voltage generating circuit 204 generates a positive-side control voltage $V_C$ and supplies the voltage $V_C$ commonly to all the gain variable amplifiers 201, 202 and 203. On the other hand, an offset voltage generating circuit 205 generates three different offset voltages $V_{off1}$, $V_{off2}$, and $V_{off3}$ and supplies the offset voltages $V_{off1}$, $V_{off2}$, and $V_{off3}$ to the gain variable amplifiers 201, 202 and 203, respectively. As a result, the gains G1, G2 and G3 of the gain variable amplifiers 201, 202 and 203 are changed as shown in FIG. 4, so that the total gain $G_{total}$ can have a wider decibel-linear relationship as compared with the first prior art gain variable amplifier apparatus of FIG. 1.

In the second gain variable amplifier apparatus of FIG. 3, however, the noise and distortion characteristics are deteriorated as compared with the first prior art gain variable amplifier of FIG. 1. For example, if the gain, noise factor and third intercept point of an i-th stage gain variable amplifier are represented by $G_i$, $F_i$ and $IP3_i$ (i=1, 2, . . . , n), respectively, the following equations are satisfied:

$$F=F_1+(F_2-1)/G_1+\ldots+(F_n-1)/G_1 G_2\ldots G_n \quad (10)$$

$$1/IP3=1/IP3_1+G_1/IP3_2+\ldots+G_1G_2\ldots G_{n-1}/IP3_n \quad (11)$$

From the equation (10), the noise factor F is subjected to each noise factor in a low gain region, while the noise factor F is subjected to $F_1$ in a high gain region. Also, the third intercept point IP3 is subjected to $IP3_1$, in a low gain region, while the third intercept point IP3 is subjected to $IP3_n$ in a high gain region. Thus, the noise and distortion characteristics differ in the low gain region and the high gain region. Therefore, in order to improve the noise and distortion characteristics both in the low and high gain regions, each stage of the gain variable amplifiers 201, 202 and 203 needs to have good characteristics both in the low and high gain regions, which would increase the power consumption.

Figure 5:
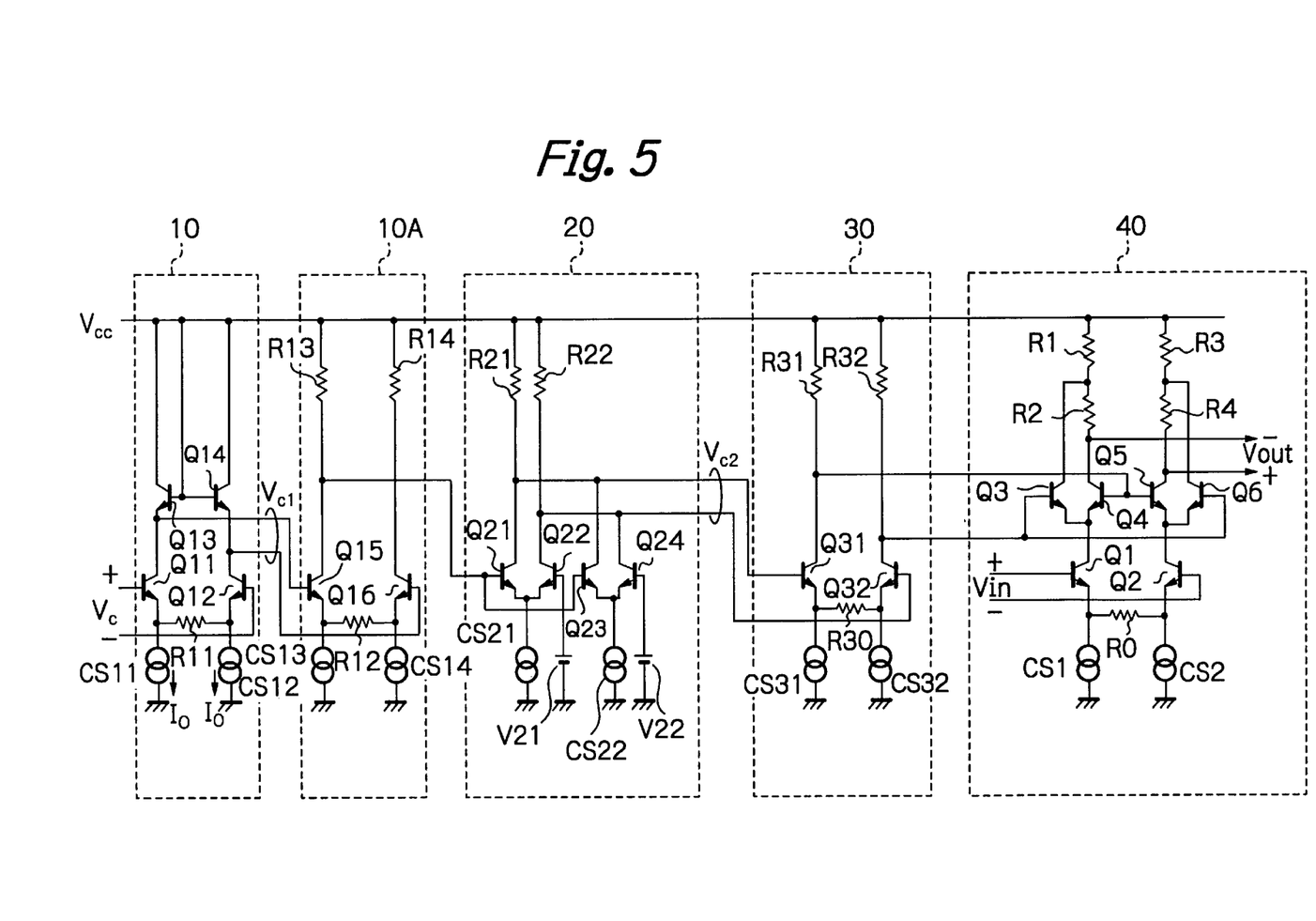
FIG. 5 is a circuit diagram illustrating an embodiment of the gain variable amplifier apparatus according to the present invention.

In FIG. 5, which illustrates an embodiment of the present invention, reference numeral 10 designates a thermal voltage proportional circuit, 10A designates a buffer, 20 designates a control voltage correction circuit, 30 designates a buffer, and 40 designates a gain variable amplifier having the same configuration as that of FIG. 1.

The thermal voltage proportional circuit 10 is a inverse hyperbolic tangent circuit which includes a voltage-current converter formed by emitter coupled transistors Q11 and Q12 and a constant current source CS11 and also includes diode-connected transistors Q13 and Q14 (see: Paul R. Gray et.al., "Analysis and Design of Analog Integrated Circuits", John Wiley & Sons, Inc., page 674, 1997). The control voltage $V_{c1}$ generated by the thermal voltage proportional circuit 10 is represented by $$V_{c1}=2V_T \tan h^{-1}(K\cdot V_C/I_{o1}) \quad (12)$$

where $I_{o1}$ is the DC current flowing through each of the transistors Q11 and Q12 when the control voltage $V_c$ is zero ($I_{o1}=I_0/2$);

K is the transconductance of the voltage-to-current converter (Q11, Q12, R11, CS11, CS12); and $I_0$ is the total current flowing through the constant current sources CS11 and CS12.

Thus, in the equation (12), since the control voltage $V_{c1}$ is proportional to the thermal voltage $V_T$, the control voltage $V_{c1}$ can be operated to compensate for the inversely-proportional component ($1/V_T$) in the equation (9).

The control voltage $V_{c1}$ is buffered by a buffer 10A including a differential amplifier formed by transistors Q15 and Q16, resistors R12, R13 and R14, and current sources CS13 and CS14.

The control voltage Vc1 is buffered by the buffer 10A including a differential amplifier formed by transistors Q15 and Q16, resistors R12, R13, and R14, and current sources CS13 and CS14.

Figure 6:
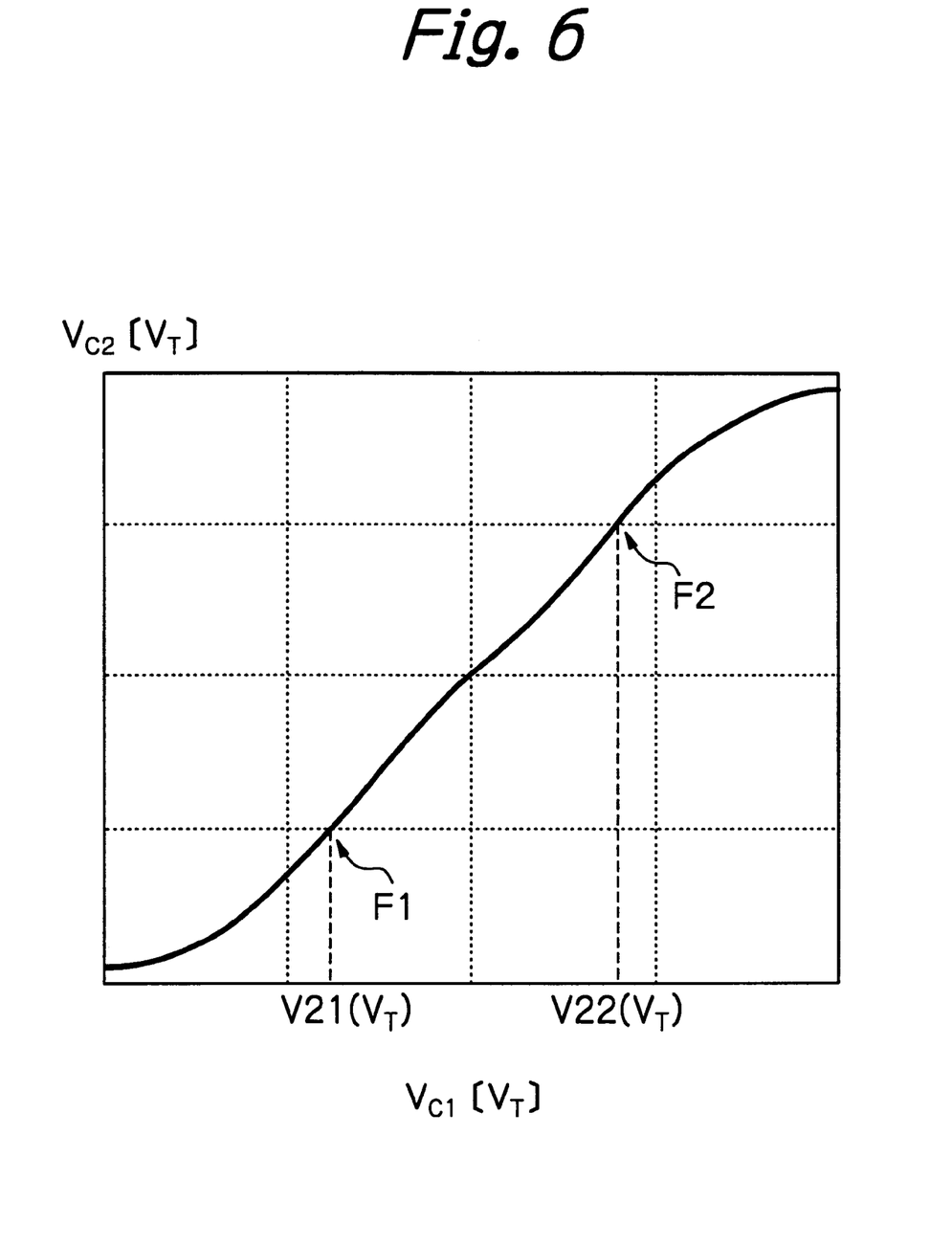
FIG. 6 is a graph showing the input/output characteristics of the control voltage correction circuit of FIG. 5.

In the control voltage correction circuit 20, the voltage of the voltage sources V21 and V22 are different from each other. As a result, as shown in FIG. 6, the input/output characteristics of the control voltage correction circuit 20 have two inflection points as indicated by F1 and F2. Thus, the control voltage correction circuit 20 can be operated to compensate for the gain G greatly deviated from the decibel-linear relationship in FIG. 2.

The buffer 30 is formed by emitter-coupled transistors Q31 and Q32 connected to a resistor R30 and constant current sources CS31 and CS32, respectively, and resistors R31 and R32. The buffer 30 is provided where the base currents flowing through the transistors Q3 to Q6 can not be neglected. Therefore, if such base currents directly supplied from the control voltage correction circuit 20 can be neglected, the buffer 30 is not provided.

Figure 7:
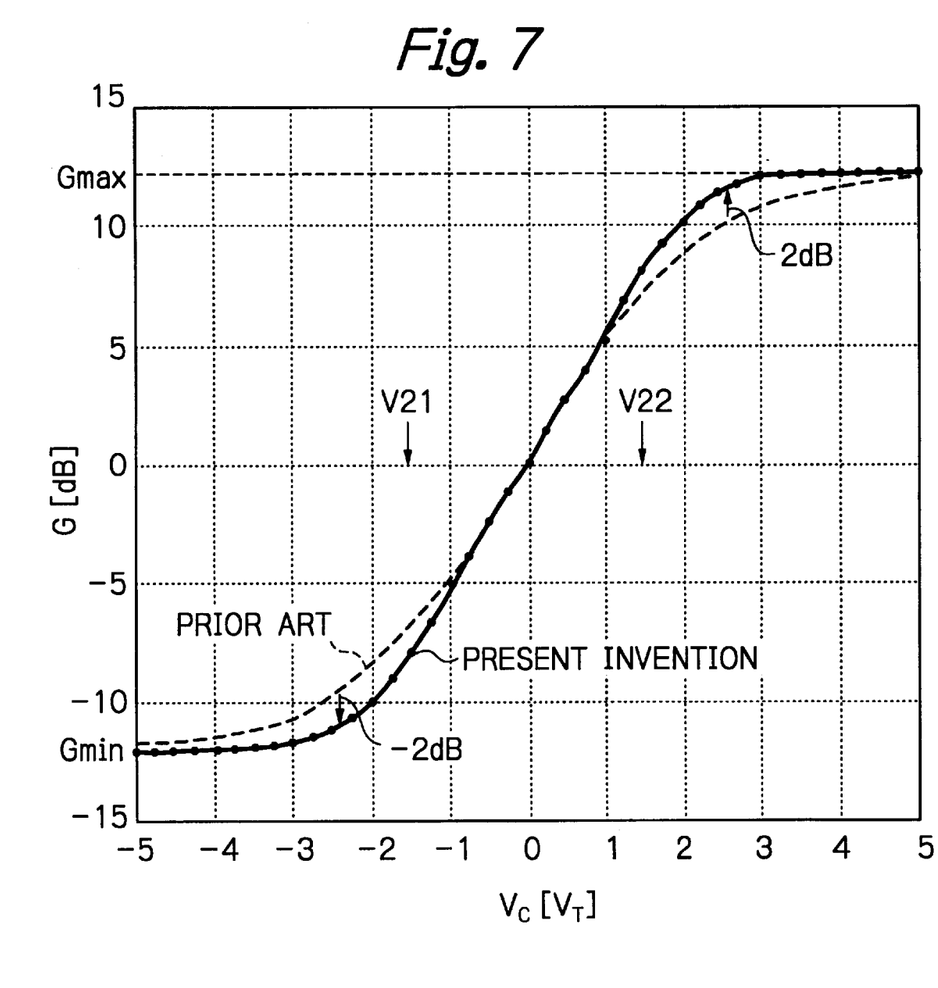
FIG. 7 is a graph showing the gain characteristics of the gain variable amplifier apparatus of FIG. 5.

If values as shown in FIG. 7 are set as the voltages of the voltage sources V21 and V22 of the control voltage correction circuit 20, the gain characteristics of the gain variable amplifier 40 is improved, thus enlarging the region of linear relationship. For example, the gain change of ±2 dB is obtained.

In the control voltage correction circuit 20, although two differential amplifiers are provided for two kinds of inflection points, three or more differential amplifiers can be provided for three or more kinds of inflection points to improve the gain control linearity characteristics.

Also, the thermal voltage proportional circuit 10 can be modified to generate balanced output signals and supply them to the control voltage correction circuit 20. In this case, an offset mechanism should be provided for each of the differential amplifiers of the control voltage correction circuit 20. For example, the sizes of the two transistors of each differential amplifier are different from each other.

Also, in the above-described embodiment, only the gain variable amplifier 40 is provided. However, a plurality of gain variable amplifiers can be connected in series to obtain a larger variable gain relationship.

Further, in the above-described embodiment, the thermal voltage proportional circuit 10 and the control voltage correction circuit 20 are both provided for compensating for the thermal voltage component in the gain characteristics and enlarging the region of the linear relationship simultaneously. However, either the thermal voltage proportional circuit 10 or the control voltage correction circuit 20 can be provided.

As explained hereinabove, according to the present invention, the thermal voltage component in the gain characteristics can be compensated for, and also, the region of the linear relationship can be enlarged, so that the number of gain variable amplifiers can be decreased, and also, other characteristics such as the noise and distortion characteristics would be improved as well as the reduction of the power consumption.

What is claimed is:

1. A gain variable amplifier apparatus comprising:
   a thermal voltage proportional circuit for converting a first control voltage into a second control voltage proportional to a thermal voltage; and
   a gain variable amplifier, connected to said thermal voltage proportional circuit, a gain of said gain variable amplifier being controlled by said second control voltage, wherein said thermal voltage proportional circuit comprises an inverse hyperbolic tangent circuit.

2. A gain variable amplifier apparatus comprising:
   a thermal voltage proportional circuit for converting a first control voltage into a second control voltage proportional to a thermal voltage; and
   a gain variable amplifier, connected to said thermal voltage proportional circuit, a gain of said gain variable amplifier being controlled by said second control voltage, further comprising:
   a control voltage correction circuit, connected between said thermal voltage proportional circuit and said gain variable amplifier, for converting said second control voltage into a third control voltage, said control voltage correction circuit including a plurality of differential amplifiers having different inflection point characteristics,
   the gain of said gain variable amplifier being controlled by said third control voltage.

3. The apparatus as set forth in claim 1, further comprising:
   a buffer connected between said control voltage correction circuit and said gain variable amplifier.

4. A gain variable amplifier apparatus comprising:
   a control voltage correction circuit including a plurality of differential amplifiers having different inflection point characteristics for converting a first control voltage into a second control voltage; and
   a gain variable amplifier, connected to said control voltage correction circuit, a gain of said gain variable amplifier being controlled by said second control voltage, said gain variable amplifier having an inherent gain characteristic curve with a first region of linearity, wherein
   said different inflection point characteristics for said control voltage correction circuit are chosen to offset the effect of a non-linear region of said gain variable amplifier inherent gain characteristic curve, thereby increasing the range of said linear gain characteristic curve for said gain variable amplifier to be larger than said first region of linearity.

5. A gain variable amplifier apparatus comprising:
   a control voltage correction circuit including a plurality of differential amplifiers having different inflection point characteristics for converting a first control voltage into a second control voltage; and
   a gain variable amplifier, connected to said control voltage correction circuit, a gain of said gain variable amplifier being controlled by said second control voltage, further comprising:
   a buffer connected between said control voltage correction circuit and said gain variable amplifier.

* * * * *